United States Patent [19]

daCosta et al.

[11] 4,403,567

[45] Sep. 13, 1983

[54] WORKPIECE HOLDER

[75] Inventors: Harry daCosta, Paradise Valley, Ariz.; Hugh K. Howerton, Falls Church, Va.; William E. Hughes, Annandale, Va.; Gaines W. Monk, Alexandria, Va.

[73] Assignee: Commonwealth Scientific Corporation, Alexandria, Va.

[21] Appl. No.: 179,960

[22] Filed: Aug. 21, 1980

[51] Int. Cl.³ .............................................. B05C 13/02
[52] U.S. Cl. ..................................... 118/500; 118/50; 118/724; 118/732; 118/730; 165/80 E; 165/104.17; 269/21
[58] Field of Search ............... 118/724, 500, 730, 729, 118/732, 319, 59, 69, 900, 50; 269/21; 252/70; 165/104 R, 104 S, 80 R, 80 D, 80 E, 185, 104 M, 104.15, 104.19, 104.21, 104.17, 104.33, 104.11; 204/298

[56] References Cited

U.S. PATENT DOCUMENTS

| | | | |
|---|---|---|---|
| 3,369,989 | 2/1968 | Kay et al. | 118/59 X |
| 3,780,356 | 12/1973 | Laing | 165/80 R X |
| 4,091,257 | 5/1978 | Anthony et al. | 118/900 X |
| 4,139,051 | 2/1979 | Jones et al. | 165/133 X |
| 4,187,801 | 2/1980 | Monk | 118/500 X |
| 4,244,148 | 1/1981 | Chabaron et al. | 252/70 X |
| 4,274,476 | 6/1981 | Garrett | 165/80 E |
| 4,292,189 | 9/1981 | Chen | 252/70 |

FOREIGN PATENT DOCUMENTS 2851255  5/1979  Fed. Rep. of Germany ...... 118/730

*Primary Examiner*—John D. Smith
*Assistant Examiner*—Bernard F. Plantz
*Attorney, Agent, or Firm*—Cushman, Darby & Cushman

[57] ABSTRACT

A workpiece holder for semiconductor workpieces during treatment with a substantially cylindrical casing shaped like a hockey puck having an upper surface for receiving a workpiece, a lower surface, at least one bore between the surfaces for applying a vacuum and a hollow interior for a heat absorbing composition preferably one which melts above ambient temperature but below temperatures which might damage workpieces. Suitable compositions include Glauber's salt, and calcium chloride hexahydrate. In one embodiment, curved, substantially radially extending vanes are preferably provided in the interior space for causing radial flow when the casing is rotated or oscillated. In a second embodiment, a plurality of bores extend between a manifold which extends radially and a plurality of circumferential grooves.

12 Claims, 6 Drawing Figures

WORKPIECE HOLDER

BRIEF DESCRIPTION OF THE BACKGROUND AND SUMMARY OF THE INVENTION

The invention relates to a holder for workpieces during treatment.

In many processes, workpieces are treated, for example, by coating, spraying, etching, ion implantation, etc., in a manner which undesirably heats the workpiece. Maintaining the workpiece relatively cool, i.e., below temperatures where damage can occur to the workpieces or masking materials is a particular problem in treating semiconductor wafers in vacuum.

Typically, workpieces such as semiconductor wafers are mounted on individual cylindrical holders and transported in a treatment area in which vacuum is maintained so that each workpiece is uniformly treated. During treatment, heat is produced and must be efficiently and effectively transferred away from the workpieces.

One way in which this can be done is to mount the workpiece holder in contact with a plate and to slide the workpiece holders along the plate while a cooling fluid is circulated underneath or through the plate. U.S. Pat. No. 4,187,801 issued Feb. 12, 1980 describes an apparatus of this type. While this approach is effective, it necessitates a relatively complex transporting system in which the workpiece holders must be slid and maintained in contact with the plate. Another approach to maintaining the workpieces cool is to mount them on an elastomeric disc which is in turn mounted on a workpiece holder. Preferably, the disc has a number of holes in it which are communicated to a vacuum source so that the workpiece is drawn to and held tightly on the elastomeric disc. U.S. Application, Ser. No. 953,214, filed Oct. 20, 1978 describes a workpiece holder of this type, and the patent to Jones U.S. Pat. No. 4,139,051 describes a similar holder.

The present invention relates to a unique workpiece holder particularly effective for cooling semiconductor workpieces during treatment in which a casing which is preferably substantially cylindrical and resembles a "hockey puck" includes a hollow interior space filled with a composition which absorbs heat from the workpiece during treatment, thus maintaining the workpiece relatively and satisfactorily cool. The workpieces are mounted on an upper surface of the holder with a bore preferably extending between the upper and lower surfaces for applying a vacuum to that upper surface to hold a workpiece thereon. Alternatively, an overpressure can be applied on top of the wafer to insure contact between the workpiece and holder.

Any of a number of different compositions including Glauber's salt (sodium sulfate decahydrate), and calcium chloride hexahydrate provide satisfactory heat absorbing characteristics. A circular groove is preferably provided in the peripheral surface between the upper and lower surfaces so that the holder can be readily transported on rails which enter into the groove and rotated or oscillated during treatment. The upper surface is preferably thick enough to prevent bowing of that surface when vacuum is applied or with changes in ambient pressure. Other means of pressure relief such as a bellows port can alternatively be used.

In a first embodiment, a plurality of curved, generally radially extending vanes can be provided within the interior space to promote generally radial flow during rotation or oscillation and thus good heat distribution within the interior space. After treatment, the holder must be cooled and this can be accomplished by rotating or oscillating in a refrigerated environment, the radial flow promoted by the vanes cooling all of the areas of the interior space at substantially the same time.

In a second embodiment of the present invention, the "hockey puck" is formed with top and bottom portions which are threaded together with an O-ring to provide a satisfactory seal which is maintained under treatment conditions. Further, the surface on which the elastomeric disc and the semiconductive wafer are retained is preferably provided with a plurality of circumferential grooves, each of which is connected by a downwardly extending bore to a manifold which extends radially to a nipple at the side of the workpiece holder to which a vacuum source can be coupled. Thus, no bore is provided through the space in which the heat conducting material is contained. This makes the structure mechanically simpler and, in addition, the workpiece holder does not have to be moved in order to be attached to a vacuum source. A flexure plate is preferably utilized in a recess in the peripheral surface between the upper and lower surfaces for latching the top to a clamp.

Other objects and purposes of the invention will be clear from the following detailed description of the drawings.

DETAILED DESCRIPTION OF THE DRAWINGS

Figure 1:
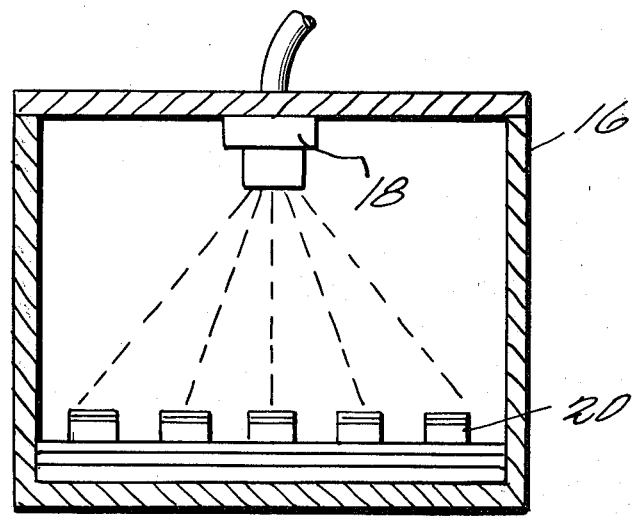
FIG. 1 shows a schematic view of a plurality of workpiece holders in a schematically illustrated treatment chamber.

Reference is now made to FIG. 1 which illustrates a schematic treatment chamber 16 having a beam source 18, for example, an ion beam source and a plurality of workpiece holders 20 according to the present invention disposed and transported therein for treatment. As described above, each of these holders contains a composition which absorbs heat from the workpiece during treatment, maintaining the workpiece relatively and satisfactorily cool.

Figure 2:
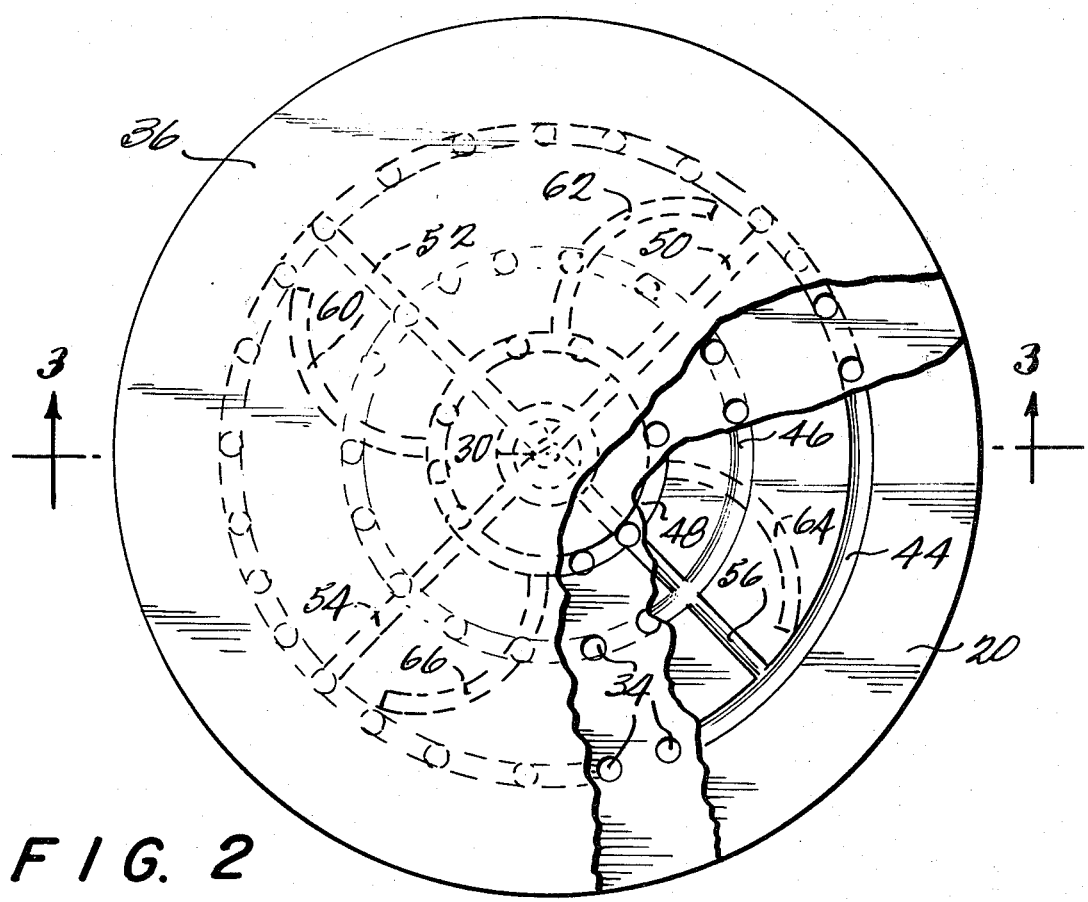
FIG. 2 shows a top view of a first embodiment of the present invention with a portion of the elastomeric disc and a greater portion of a semiconductor wafer on the elastomeric disc thereon removed so that the upper surface of the workpiece holder and portions of the elastomeric disc can be readily seen.
Figure 3:
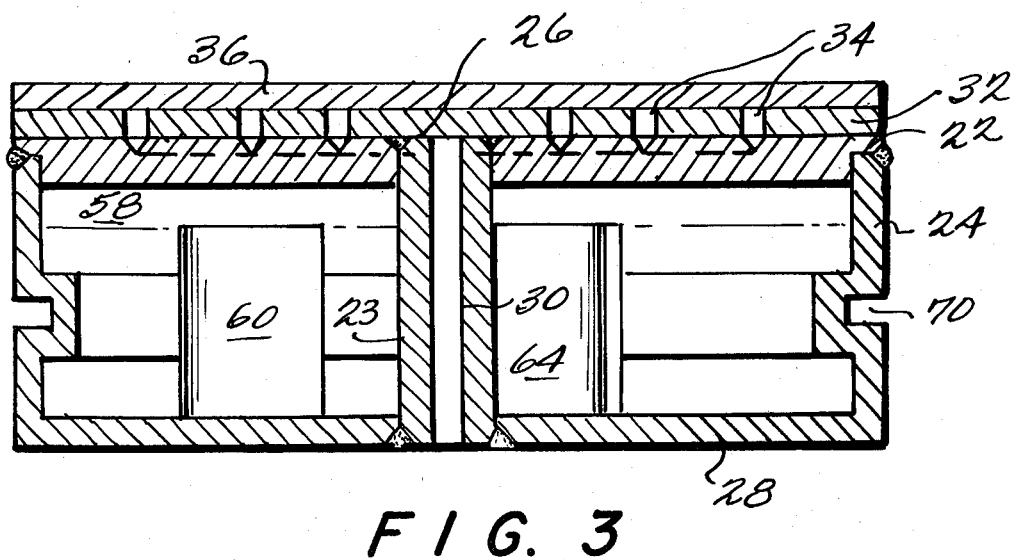
FIG. 3 shows a sectional view of the holder of FIG. 2 along line 2—2 with the elastomeric disc and the semiconductive wafer in place.

FIGS. 2 and 3 illustrate a first embodiment of the present invention. Holder 20 is preferably formed of copper or any other suitable material and is formed into parts 22, 23, and 24 which when brazed or otherwise fastened together provide a generally cylindrical housing with upper surface 26 onto which workpieces are placed for treatment and a lower surface 28. At least the upper surface, and preferably both surfaces, are made to be thick enough so as not to bow when a vacuum is applied or during processing.

A bore 30 extends between the upper and lower surfaces for application of a vacuum. An elastomeric disc 32, for example, containing metal particles as described in the above-mentioned patent application, and having a series of rings or perforations 34, is preferably mounted on the upper surface 26 and a workpiece 36 to be treated, for example, a cylindrical semiconductive wafer, placed thereon. Upper surface 26 is provided with circular grooves 44, 46, and 48 together with radially extending grooves 50, 52, 54 and 56 which serve to communicate the rings of perforations 34 of elastomeric disc 32 and workpiece 36 atop that disc with bore 30 and with a vacuum source (not shown) connected to bore 30 from the lower surface 28. Application of a vacuum causes workpiece 36 to adhere in good heat conducting relation to disc 32 as air is removed therefrom through perforations 34.

Interior space 58 within casing 20 contains a composition of the type which effectively absorbs heat when it melts. Two examples of suitable compositions include sodium sulfate decahydrate (Glauber's salt) and calcium chloride hexahydrate. Gillium and other compositions having a high latent heat of fusion, including metals other than gallium, could provide suitable cooling, but are probably too expensive to be practical for most applications. Glauber's salt is widely used in solar heating and cooling applications.

A plurality of curved, generally radially extending vanes 60, 62, 64 and 66 are provided within interior space 58 and are upstanding from lower surface 28 for promoting generally radial or agitated flow of the composition when the device is rotated or oscillated. These vanes insure circulation of the composition. A groove 70 extends around the periphery of holder 20 for receiving rails to transport and rotate or oscillate the workpiece during treatment.

Compositions are preferred which are solid at ambient temperatures and which melt at the temperatures to which workpieces can be raised during treatment without damage, for example, 20°–30° C. The latent heat which must be absorbed before melting takes place keeps the temperature of the workpiece within acceptable limits during treatment. Higher melting temperatures, for example, about 50°–60° C. may be acceptable for some applications. In addition, compositions which are non-toxic, safe to handle and inexpensive are preferred. Glauber's salt and calcium chloride hexahydrate meet these qualifications.

In the embodiment of FIG. 1, the holders with workpieces thereon can be placed on a container which is then evacuated, rather than being evacuated individually. Pushing the workpieces firmly against the disc or upper surface of the holder by pads or the like may give the same adhesion as individual evacuation through a central bore. The bore can be used to release the workpiece after treatment.

Figure 4:
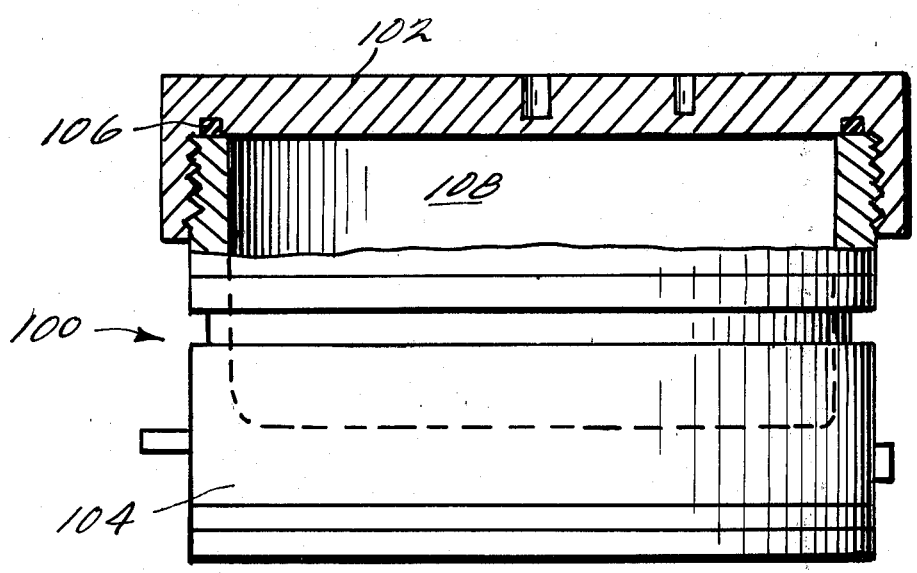
FIG. 4 shows a side view of a second embodiment of the invention.
Figure 5:
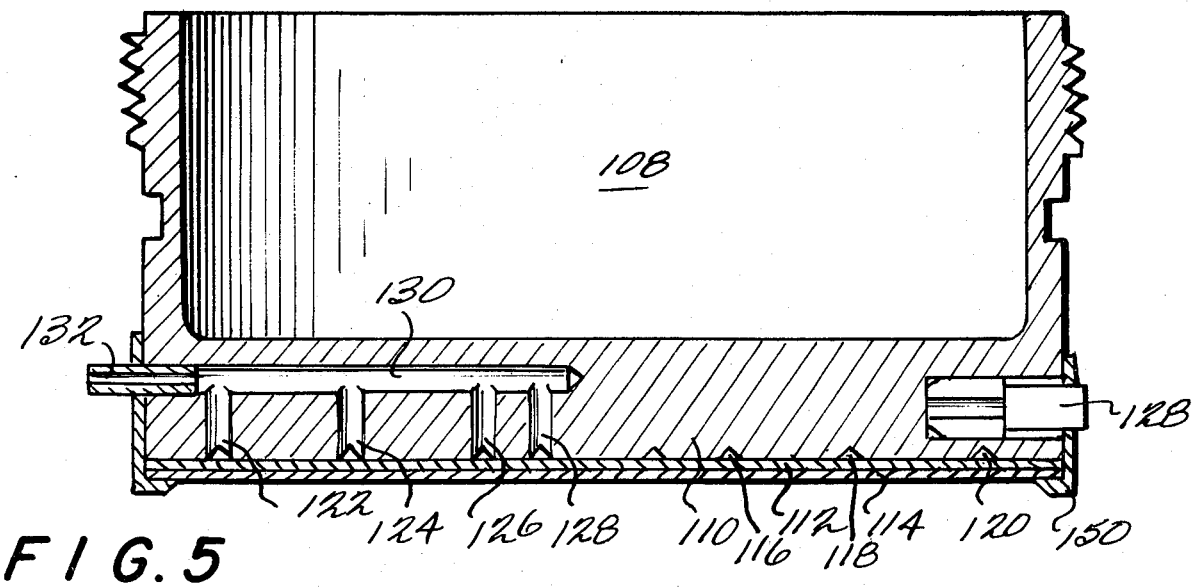
FIG. 5 shows a sectional view of the base for the holder of FIG. 4.
Figure 6:
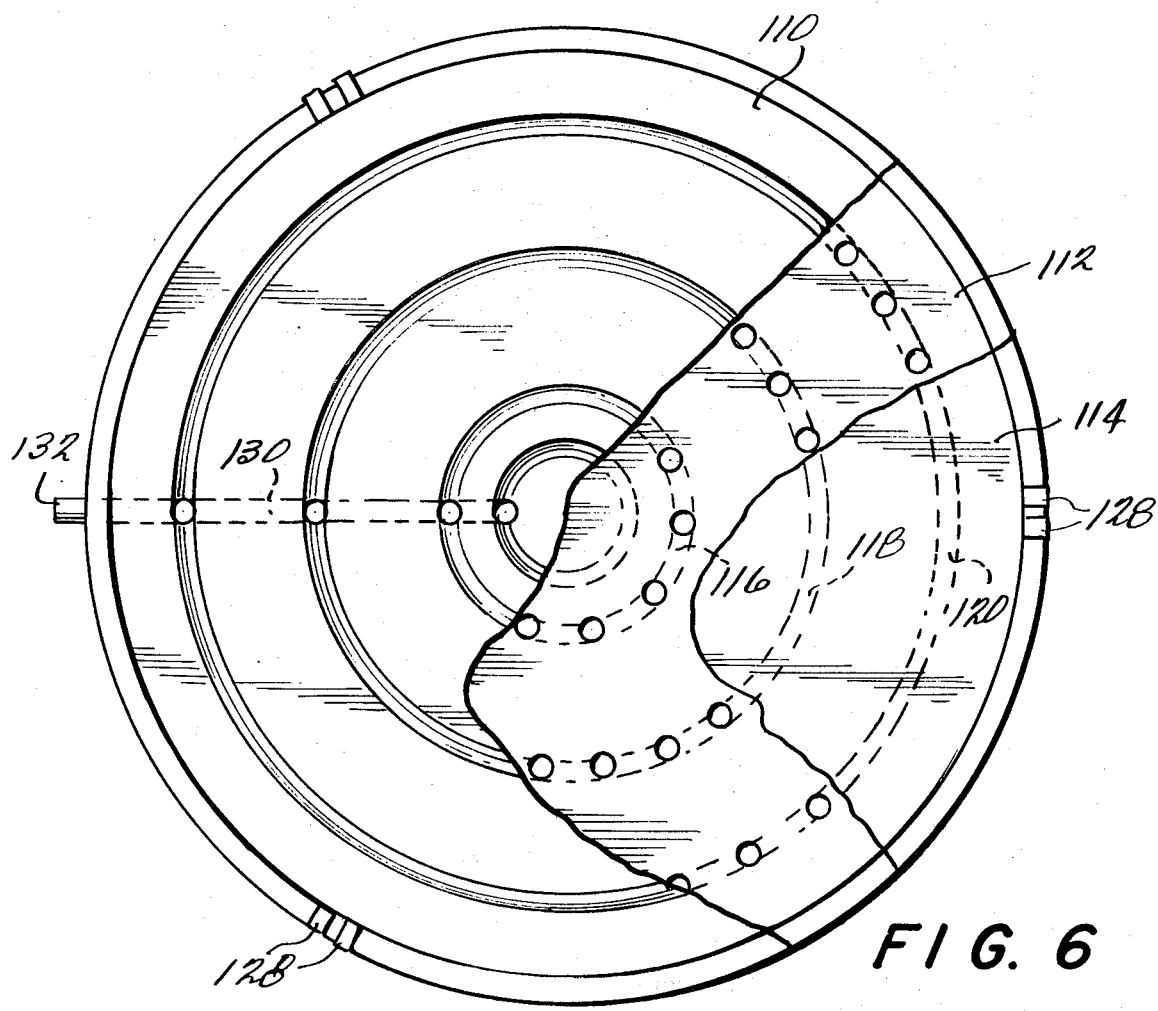
FIG. 6 shows a plan view of the base of FIGS. 4 and 5 with a portion of an elastomeric disc and the greater portion of a semiconductor wafer thereon removed.

Reference is now made to FIGS. 4–6 which illustrate a second embodiment of the present invention. In the embodiment of these FIGURES, workpiece holder 100 is formed with a top 102 and a base 104 which are threaded as illustrated and connected together with an O-ring 106 to provide a reliable seal. In interior space 108 a suitable composition such as described above is provided. As can be best seen in FIG. 5, surface 110 onto which an elastomeric disc 112 is described above, and a workpiece 114 are provided includes circumferential rings of grooves 116, 118 and 120 which match the rings of perforations in disc 112. As shown in FIG. 6, grooves 116, 118 and 120 are connected by bores 122, 124, 126 and 128 to a radially extending manifold 130 which extends to a nipple 132 to which a suitable source of vacuum (not shown) can be connected. A flex disc 128 is also provided in base 104 for holding a clamp 150 in place over disc 112 and the workpiece, if desired.

Many changes and modifications can, of course, be carried out without departing from the scope of the present invention. That scope is intended to be limited only by the scope of the appended claims.

What is claimed is:

1. A workpiece holder for semiconductor workpieces during treatment comprising:
   a casing having an upper exterior surface for receiving and holding a workpiece thereon, an opposed lower surface and a hollow interior having a fixed space; and
   a heat absorbing composition chosen from the group consisting of Glauber's salt and calcium chloride hexahydrate sealed within said interior for absorbing heat from said workpiece during treatment.

2. A workpiece holder for semiconductor workpieces during treatment comprising:
   a casing having an upper exterior surface for receiving and holding a workpiece thereon, an opposed lower surface, and a hollow interior;
   a heat absorbing composition sealed within said interior for absorbing heat from said workpiece during treatment; and
   a plurality of curved, substantially radially extending vanes in said interior space for causing radial flow of said composition when said casing is rotated or oscillated.

3. A holder as in claim 1, wherein said casing includes a bore communicating with said upper surface for removing air therefrom, to adhere said workpiece to said upper surface.

4. A workpiece holder for semiconductor workpieces during treatment comprising:
   a casing having an upper exterior surface for receiving and holding a workpiece thereon, an opposed lower surface, a hollow interior, a bore extending axially between said surfaces for removing air from said upper surface to adhere said workpiece to said upper surface, a plurality of circular grooves on said upper surface and a plurality of grooves on said upper surface extending radially outward from said bore; and
   a heat absorbing composition sealed within said interior for absorbing heat from said workpiece during treatment.

5. A workpiece holder for semiconductor workpieces during treatment comprising:
   a casing having an upper exterior surface for receiving and holding a workpiece thereon, an opposed lower surface, a hollow interior, a bore communicating with said upper surface for removing air therefrom to adhere said workpiece to said upper surface, a plurality of circular grooves on said upper surface, a plurality of bores extending in an axial direction toward said lower surface from said grooves and a radially extending manifold connected to said bores and adapted to be connected to a vacuum source at the peripheral surface of said casing for removing air from said upper surface to adhere said workpiece to said upper surface; and a heat absorbing composition sealed within said interior for absorbing heat from said workpiece during treatment.

6. A workpiece holder for semiconductor workpieces during treatment comprising:

a casing formed of a threaded base and threaded top which are screwed together and having an upper exterior surface for receiving and holding a workpiece thereon, an opposed lower surface, and a hollow interior; and a heat absorbing composition sealed within said interior for absorbing heat from said workpiece during treatment.

7. A holder as in claim 1, wherein said casing has a groove extending about the peripheral surface between said upper and lower surfaces.

8. A holder as in claim 1, wherein said casing is made of copper.

9. A workpiece holder for semiconductor workpieces during treatment comprising:

a casing having an upper exterior surface for receiving and holding a workpiece thereon, an opposed lower surface, a hollow interior and a bore communicating with said upper surface for removing air therefrom to adhere said workpiece to said upper surface, a metal filled elastomer disc on said upper surface for receiving said workpiece and having perforations extending therethrough and in communication with said bore; and a heat absorbing composition sealed within said interior for absorbing heat from said workpiece during treatment.

10. A workpiece holder for semiconductor workpieces during treatment comprising:

a casing having an upper exterior surface for receiving and holding a workpiece thereon, an opposed lower surface and a hollow interior having a fixed space;

a heat absorbing composition chosen from the group consisting of Glauber's salt and calcium chloride hexahydrate sealed within said interior for absorbing heat from said workpiece during treatment; and a flexure disc mounted in a recess in the peripheral surface between the upper and lower surfaces for engaging a workpiece clamp to attach said clamp to said holder.

11. A holder as in claim 1 or 10 wherein said casing is substantially cylindrical.

12. A workpiece holder for a semiconductor workpiece during treatment, which treatment heats said workpiece comprising:

a closed case having a hollow interior with a fixed space and an upper exterior surface for receiving a workpiece to be treated; and a composition sealed in said case which changes between solid and liquid states in the range of 20°–30° C. for absorbing heat from said workpiece during treatment.

* * * * *